United States Patent
Mishima

(10) Patent No.: US 10,665,806 B2
(45) Date of Patent: May 26, 2020

(54) ORGANIC EL ELEMENT AND ORGANIC EL DISPLAY PANEL

(71) Applicant: JOLED INC., Tokyo (JP)

(72) Inventor: Kosuke Mishima, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/359,222

(22) Filed: Mar. 20, 2019

(65) Prior Publication Data

US 2019/0221765 A1 Jul. 18, 2019

Related U.S. Application Data

(62) Division of application No. 15/718,381, filed on Sep. 28, 2017, now Pat. No. 10,283,727.

(30) Foreign Application Priority Data

Sep. 30, 2016 (JP) .................................. 2016-192871

(51) Int. Cl.
*H01L 29/08* (2006.01)
*H01L 51/50* (2006.01)
(Continued)

(52) U.S. Cl.
CPC ...... *H01L 51/5004* (2013.01); *H01L 51/5012* (2013.01); *H01L 51/5072* (2013.01); *H01L 51/5076* (2013.01); *H01L 51/5092* (2013.01); *H01L 51/5275* (2013.01); *H01L 51/56* (2013.01); *H01L 51/0097* (2013.01); *H01L 51/5218* (2013.01); *H01L 51/5234* (2013.01); *H01L 2251/301* (2013.01); *H01L 2251/5338* (2013.01); *H01L 2251/552* (2013.01); *H01L 2251/558* (2013.01)

(58) Field of Classification Search
CPC . H01L 51/00; H01L 51/5004; H01L 51/5012; H01L 51/5072; H01L 51/5092; H01L 51/5275
See application file for complete search history.

(56) References Cited

U.S. PATENT DOCUMENTS

| 2007/0024168 A1 | 2/2007 | Nishimura et al. |
| 2012/0168735 A1 | 7/2012 | Pflumm et al. |

(Continued)

FOREIGN PATENT DOCUMENTS

| JP | 2007-149605 | 6/2007 |
| JP | 2012-216681 | 11/2012 |

(Continued)

*Primary Examiner* — Phuc T Dang
(74) *Attorney, Agent, or Firm* — Greenblum & Bernstein, P.L.C.

(57) ABSTRACT

An organic EL element includes an anode, a cathode opposing the anode, a light-emitting layer disposed between the anode and the cathode, an electron transport layer disposed in contact with a cathode-side surface of the light-emitting layer, and an electron injection layer disposed between the electron transport layer and the cathode, in contact with the electron transport layer. A difference between the lowest unoccupied molecular orbital (LUMO) level of the light-emitting layer and the LUMO level of the electron transport layer is at least 0.5 eV. The film thickness of the electron injection layer is greater than the film thickness of the electron transport layer.

18 Claims, 6 Drawing Sheets

(51) Int. Cl.
*H01L 51/52* (2006.01)
*H01L 51/56* (2006.01)
*H01L 51/00* (2006.01)

(56) References Cited

U.S. PATENT DOCUMENTS

| | | |
|---|---|---|
| 2014/0197401 A1 | 7/2014 | Kroeber et al. |
| 2015/0077966 A1 | 3/2015 | Bessho et al. |
| 2015/0108444 A1 | 4/2015 | Jiao et al. |
| 2015/0280164 A1 | 10/2015 | Lin et al. |
| 2015/0333284 A1 | 11/2015 | Fujimura et al. |
| 2016/0035993 A1* | 2/2016 | Yang .................. H01L 51/5008 257/40 |
| 2016/0285010 A1 | 9/2016 | Yoon et al. |
| 2017/0018372 A1 | 1/2017 | Fujimura |
| 2017/0033308 A1* | 2/2017 | Mishima ............. H01L 51/5004 |
| 2017/0279067 A1* | 9/2017 | Ushikubo ........... H01L 27/3244 |

FOREIGN PATENT DOCUMENTS

| | | |
|---|---|---|
| JP | 2013-504882 | 2/2013 |
| JP | 2013-514665 | 4/2013 |
| JP | 2014-529894 | 11/2014 |
| JP | 2015-164204 | 9/2015 |
| WO | 2011/075359 | 6/2011 |

* cited by examiner

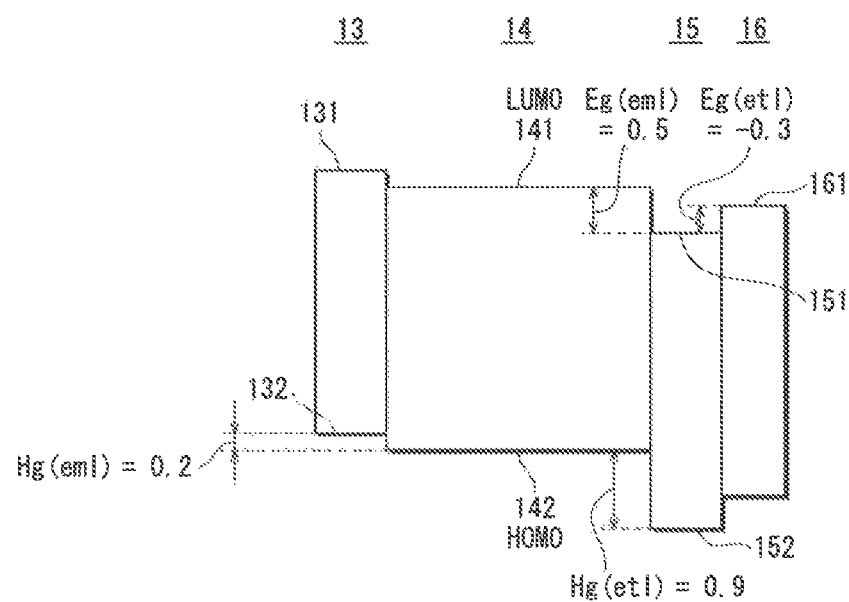

| sample | Electron transport layer Film thickness (nm) | Intermediate layer Film thickness (nm) | Electron injection layer | | Drive voltage (relative value) | Light emission efficiency (relative value) | Lifetime (relative value) |
|---|---|---|---|---|---|---|---|
| | | | Film thickness (nm) | Ba concentration (wt%) | | | |
| A | 15 | 0 | 105 | 5 | 100 | 100 | 100 |
| B | 120 | 0 | 3 | 30 | 149 | 59 | 63 |
| C | 15 | 105 | 3 | 30 | 135 | 75 | 47 |

ORGANIC EL ELEMENT AND ORGANIC EL DISPLAY PANEL

This application is a Divisional of U.S. patent application Ser. No. 15/718,381, filed Sep. 28, 2017, now U.S. Pat. No. 10,283,727, which claims the benefit of priority of Japanese Application No. 2016-192871, filed Sep. 30, 2016, the contents of each of which are hereby incorporated by reference in their entirety.

BACKGROUND OF THE DISCLOSURE

(1) Technical Field

The present invention relates to energy band structures and thicknesses of functional layers in organic electroluminescence (EL) elements that have a resonator structure.

(2) Description of Related Art

In recent years, display devices using organic EL elements are becoming widespread.

An organic EL element has a structure in which at least a light-emitting layer is sandwiched between an anode and a cathode.

Typically, the difference between an energy level of the lowest unoccupied molecular orbital (LUMO) of an organic material in a light-emitting layer (hereinafter, "LUMO level") and a Fermi level of a cathode material is large. Thus, the organic EL element has a configuration in which a functional layer (electron injection layer, electron transport layer, etc.) for supplying electrons to the light-emitting layer is between the light-emitting layer and the cathode.

Further, in the organic EL element, an optical resonator structure is provided between a face of the anode facing the cathode and a face of the cathode facing the anode. In other words, by aligning phases of light transmitted from the light-emitting layer through a light transmissive electrode and light reflected at least once at the face of the electrode, light emitted from the light-emitting layer is mutually strengthened so as to improve light extraction efficiency (see JP 2007-149605).

SUMMARY OF THE DISCLOSURE

In view of the above, the present disclosure aims to provide an organic EL element that employs an optical resonator structure using first order or higher light interference and that has a reduced drive voltage, improved light emission efficiency, and improved lifetime. Here, first order light interference is a design for which film thickness is greater than a design with a smallest distance between the light-emitting layer and the cathode (zero order light interference).

In order to achieve this aim, one aspect of the present disclosure is an organic EL element comprising: an anode; a cathode opposing the anode; a light-emitting layer disposed between the anode and the cathode; an electron transport layer disposed in contact with a cathode-side surface of the light-emitting layer; and an electron injection layer disposed between the electron transport layer and the cathode, in contact with the electron transport layer, wherein a difference between lowest unoccupied molecular orbital (LUMO) level of the light-emitting layer and LUMO level of the electron transport layer is at least 0.5 eV, and film thickness of the electron injection layer is greater than film thickness of the electron transport layer.

Accordingly, the present invention achieves an organic EL element that can have an optical resonator structure using first order or higher optical interference, and that has a decreased drive voltage and improved light emission efficiency and lifetime.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one specific embodiment of the technology pertaining to the present disclosure.

FIG. 1 schematically illustrates a structure of organic EL element 1 pertaining to Embodiment 1.

FIG. 2 is a band diagram illustrating an energy band structure of organic EL element 1 pertaining to Embodiment 1.

FIG. 6A shows TFT substrate 21, FIG. 6B shows anode 11 formed on TFT substrate 21, FIG. 6C shows bank layer 22 formed on TFT substrate 21 and anode 11, FIG. 6D shows hole injection layer 12 formed on anode 11 in an aperture portion 22a of bank layer 22, FIG. 6E shows hole transport layer 13 formed on hole injection layer 12 in the aperture portion 22a of bank layer 22, and FIG. 6F shows light-emitting layer 14 formed on hole transport layer 13 in the aperture portion 22a of bank layer 22.

FIG. 7A shows electron transport layer 15 formed on light-emitting layer 14 and bank layer 22, FIG. 7B shows electron injection layer 16 formed on electron transport layer 15, FIG. 7C shows cathode 17 formed on electron injection layer 16, and FIG. 7D shows sealing layer 23 formed on cathode 17.

DESCRIPTION OF EMBODIMENTS

Figures 3, 4:
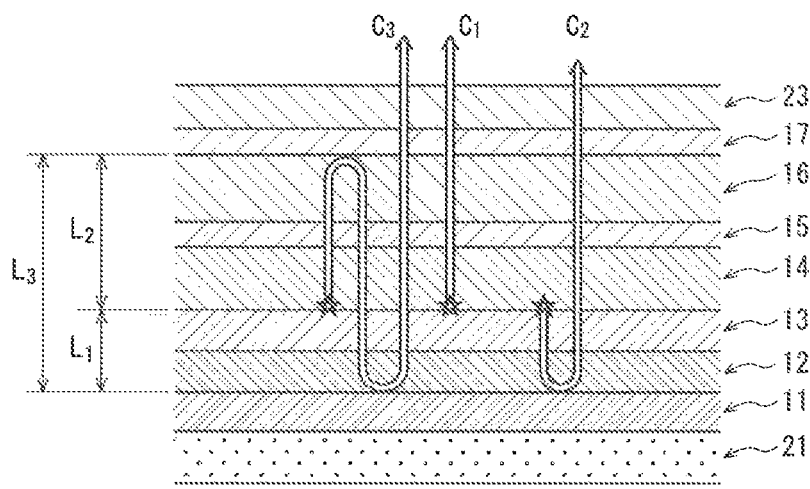
FIG. 3 is a cross-section schematically illustrating an optical resonator structure of organic EL element 1 pertaining to Embodiment 1.
FIG. 4 is a table showing drive voltage, light emission efficiency, and lifetime of organic EL element 1 pertaining to Embodiment 1, comparative example 1, and comparative example 2.

An organic EL element pertaining to one aspect of the present disclosure is an organic EL element comprising: an anode; a cathode opposing the anode; a light-emitting layer disposed between the anode and the cathode; an electron transport layer disposed in contact with a cathode-side surface of the light-emitting layer, and an electron injection layer disposed between the electron transport layer and the cathode, in contact with the electron transport layer, wherein LUMO level of the electron transport layer is lower than at least one of LUMO level of the electron injection layer and Fermi level of a metal material included in the electron injection layer, and film thickness of the electron injection layer is greater than film thickness of the electron transport layer.

An organic EL element pertaining to another aspect of the present disclosure is an organic EL element comprising: an anode; a cathode opposing the anode; a light-emitting layer disposed between the anode and the cathode; an electron transport layer disposed in contact with a cathode-side surface of the light-emitting layer, and an electron injection layer disposed between the electron transport layer and the cathode, in contact with the electron transport layer, wherein the electron transport layer includes a metal material, Fermi level of the metal material included in the electron transport layer is lower than at least one of LUMO level of the electron injection layer and Fermi level of a metal material included in the electron injection layer, and film thickness of the electron injection layer is greater than film thickness of the electron transport layer.

According to the organic EL elements pertaining to the aspects above, an energy barrier for injection of electrons from the cathode to the electron transport layer (hereinafter, "electron injection barrier") takes a negative value. Thus, size of the electron injection barrier from the electron injection layer to the light-emitting layer is dominant in the electron injection barrier from the cathode to the light-emitting layer, and is not affected by film thickness of the electron injection layer. Accordingly, by increasing film thickness of the electron injection layer to form the optical resonator structure, it is possible to improve light extraction efficiency and lifetime of the organic EL element.

Further, according to another example of the organic EL element pertaining to an aspect of the present disclosure, the LUMO level of the electron transport layer is at least 0.3 eV lower than at least one of the LUMO level of the electron injection layer and the Fermi level of the metal material included in the electron injection layer.

Further, according to another example of the organic EL element pertaining to an aspect of the present disclosure, the Fermi level of the metal material in the electron transport layer is at least 0.3 eV lower than at least one of the LUMO level of the electron injection layer and the Fermi level of the metal material included in the electron injection layer.

Further, according to another example of the organic EL element pertaining to an aspect of the present disclosure, a difference between LUMO level of the light-emitting layer and the LUMO level of the electron transport layer is at least 0.5 eV.

Further, according to another example of the organic EL element pertaining to an aspect of the present disclosure, a difference between LUMO level of the light-emitting layer and the Fermi level of the metal material included in the electron transport layer is at least 0.5 eV.

Thus, the electron injection barrier from the electron transport layer to the light-emitting layer is sufficiently large with respect to the electron injection barrier from the electron injection layer to the electron transport layer, and influence of film thickness of the electron injection layer on properties such as drive voltage, light emission efficiency, and lifespan of the organic EL element is further reduced.

An organic EL element pertaining to another aspect of the present disclosure is an organic EL element comprising: an anode; a cathode opposing the anode; a light-emitting layer disposed between the anode and the cathode; an electron transport layer disposed in contact with a cathode-side surface of the light-emitting layer; and an electron injection layer disposed between the electron transport layer and the cathode, in contact with the electron transport layer, wherein a difference between LUMO level of the light-emitting layer and LUMO level of the electron transport layer is at least 0.5 eV, and film thickness of the electron injection layer is greater than film thickness of the electron transport layer.

An organic EL element pertaining to another aspect of the present disclosure is an organic EL element comprising: an anode; a cathode opposing the anode; a light-emitting layer disposed between the anode and the cathode; an electron transport layer disposed in contact with a cathode-side surface of the light-emitting layer, and an electron injection layer disposed between the electron transport layer and the cathode, in contact with the electron transport layer, wherein the electron transport layer includes a metal material, a difference between LUMO level of the light-emitting layer and Fermi level of the metal material included in the electron transport layer is at least 0.5 eV, and film thickness of the electron injection layer is greater than film thickness of the electron transport layer.

According to the organic EL element pertaining to the aspect of the present disclosure described above, the electron injection barrier from the electron transport layer to the light-emitting layer is large. Thus, size of the electron injection barrier from the electron injection layer to the light-emitting layer is dominant in the electron injection barrier from the cathode to the light-emitting layer, and is not affected by film thickness of the electron injection layer. Accordingly, by increasing film thickness of the electron injection layer to form the optical resonator structure, it is possible to improve light extraction efficiency and lifetime of the organic EL element.

An organic EL element pertaining to another aspect of the present disclosure is an organic EL element comprising: an anode; a cathode opposing the anode; a light-emitting layer disposed between the anode and the cathode; an electron transport layer disposed in contact with a cathode-side surface of the light-emitting layer, and an electron injection layer disposed between the electron transport layer and the cathode, in contact with the electron transport layer, wherein a difference between HOMO level of the electron transport layer and HOMO level of the light-emitting layer is greater than a difference between LUMO level of the light-emitting layer and LUMO level of the electron transport layer, and film thickness of the electron injection layer is greater than film thickness of the electron transport layer.

An organic EL element pertaining to another aspect of the present disclosure is an organic EL element comprising: an anode; a cathode opposing the anode; a light-emitting layer disposed between the anode and the cathode; an electron transport layer disposed in contact with a cathode-side surface of the light-emitting layer; and an electron injection layer disposed between the electron transport layer and the cathode, in contact with the electron transport layer, wherein the electron transport layer includes a metal material, a difference between HOMO of the electron transport layer and HOMO level of the light-emitting layer is greater than a difference between LUMO level of the light-emitting layer and Fermi level of a metal material in the electron transport layer, and film thickness of the electron injection layer is greater than film thickness of the electron transport layer.

According to the organic EL element pertaining to an aspect of the present disclosure described above, the energy barrier for injecting holes from the light-emitting layer to the electron injection barrier (hereinafter, "hole injection barrier") is greater than the electron injection barrier from the electron injection layer to the light-emitting layer. Thus, movement of holes from the light-emitting layer to the electron injection layer can be prevented, and range of a recombination region of electrons and holes can be widened. Further, it is possible to improve light extraction efficiency and lifetime of the organic EL element.

Further, according to another example of the organic EL element pertaining to an aspect of the present disclosure, the difference between the HOMO level of the electron transport layer and the HOMO level of the light-emitting layer is at least 0.4 eV greater than the difference between the LUMO level of the light-emitting layer and the LUMO level of the electron transport layer.

Further, according to another example of the organic EL element pertaining to an aspect of the present disclosure, the difference between the HOMO level of the electron transport layer and the HOMO level of the light-emitting layer is at least 0.4 eV greater than the difference between the LUMO level of the light-emitting layer and the Fermi level of the metal material in the electron transport layer.

Further, according to another example of the organic EL element pertaining to an aspect of the present disclosure, the metal material included in the electron injection layer is one of an alkali metal, an alkaline earth metal, and a transition metal.

Further, according to another example of the organic EL element pertaining to an aspect of the present disclosure, the metal material included in the electron injection layer is barium.

Thus, work function of the electron injection layer is small, further improving electron injection, which contributes to reduction in power consumption by reducing drive voltage.

Further, according to another example of the organic EL element pertaining to an aspect of the present disclosure, an optical adjustment layer is disposed between the electron injection layer and the cathode.

Thus, when film thickness of the optical resonator structure is insufficient with only the electron transport layer, the optical resonator structure can be formed without affecting drive voltage, light emission efficiency, and lifetime.

Further, according to another example of the organic EL element pertaining to an aspect of the present disclosure, the anode is light-reflective, the cathode is light-transmissive, and light emitted from the light-emitting layer is emitted from the cathode side of the organic EL element.

Further, an organic EL panel pertaining to another aspect of the present disclosure is formed by a plurality of the organic EL element pertaining to an aspect of the present disclosure on a surface of a substrate.

Further, according to another example of the organic EL panel pertaining to the aspect of the present disclosure above, the substrate is a flexible substrate.

Further, according to another example of the organic EL panel pertaining to the aspect of the present disclosure above, the electron injection layer is a continuous layer across the plurality of the organic EL element.

Embodiment 1

1. Configuration of Organic EL Element

FIG. 1 schematically illustrates a cross-section structure of organic EL element 1 pertaining to the present embodiment. An organic EL element 1 includes an anode 11, a hole injection layer 12, a hole transport layer 13, a light-emitting layer 14, an electron transport layer 15, an electron injection layer 16, and a cathode 17.

In the organic EL element 1, the anode 11 and the cathode 17 are disposed with faces thereof opposing each other and the light-emitting layer 14 is disposed between the anode 11 and the cathode 17. The hole transport layer 13 is disposed in contact with the light-emitting layer 14 on the anode 11 side of the light-emitting layer 14. The hole injection layer 12 is disposed between the hole transport layer 13 and the anode 11.

The electron transport layer 15 is disposed in contact with the light-emitting layer 14 on the cathode 17 side of the light-emitting layer 14. The electron injection layer 16 is disposed between the electron transport layer 15 and the cathode 17.

The anode 11 includes a metal layer composed from a light-reflective metal material. Specific examples of light-reflective metal materials include: silver (Ag), aluminium (Al), aluminium alloy, molybdenum (Mo), silver-palladium-copper alloy (APC), silver-rubidium-gold alloy (ARA), molybdenum chromium alloy (MoCr), molybdenum tungsten alloy (MoW), and nickel chromium alloy (NiCr).

The hole injection layer 12 has a function of promoting injection of holes into the light-emitting layer 14 from the anode 11. The hole injection layer 12 may be made from an oxide of Ag, Mo, chromium (Cr), vanadium (V), tungsten (W), nickel (Ni), or iridium (Ir), or may be made from an electrically conductive polymer such as poly(3,4-ethylene-dioxythiophene) polystyrene sulfonate (PEDOT:PSS).

The hole transport layer 13 has a function of transporting holes injected from the hole injection layer 12 to the light-emitting layer 14. For example, polyfluorene or a derivative thereof, or a polymer compound such as polyarylamine or a derivative thereof may be used.

The light-emitting layer 14 sandwiched between and in contact with the hole transport layer 13 and the electron transport layer 15 has a function of emitting light via recombination of holes and electrons. A known organic material may be used as a material to form the light-emitting layer 14. For example, a phosphorescent material may be used, such as an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, fluorescent substance of a rare earth complex or similar, or metal complex emitting phosphorescence such as tris(2-phenylpyridine) iridium.

The electron transport layer 15 is formed in contact with a cathode-side surface of the light-emitting layer 14, and has a function of transporting electrons from the cathode 17 to the light-emitting layer 14 and limiting injection of electrons to the light-emitting layer 14. The function of limiting injection of electrons to the light-emitting layer 14 is realized by an energy band structure that is described later. The electron transport layer 15 is composed from an organic material that has high electron transport mobility. Further, film thickness of the electron transport layer 15 is greater than 1 nm and equal to or less than 30 nm. When the film thickness of the electron transport layer 15 is excessively thin, electrons can transfer directly from the electron injection layer 16 to the light-emitting layer 14 and there is a risk that size of an energy barrier at an interface between the electron transport layer 15 and the light-emitting layer 14 may not have sufficient effect on current flowing between the cathode 17 and the light-emitting layer 14. However, when the film thickness of the electron transport layer 15 is greater than 1 nm, direct transfer of electrons from the electron injection layer 16 to the light-emitting layer 14 can be suppressed.

As the organic material used in the electron transport layer 15, a n-electron system low-molecular-weight organic material may be used, such as an oxydiazole derivative (OXD), a triazole derivative (TAZ), or a phenanthroline derivative (BCP, Bphen).

Note that thickening of the electron transport layer 15 increases the amount of light absorption at the electron transport layer 15. In order to avoid excessive attenuation of light passing through the electron transport layer 15, it is preferable that the electron transport layer 15 has a film thickness of 30 nm or less.

The electron injection layer 16 is formed in contact with a cathode-side surface of the electron transport layer 15, and has a function of injecting electrons supplied from the cathode 17, towards the light-emitting layer 14. The electron injection layer 16 is, for example, formed from an organic material that has high electron transport mobility, doped with a metal selected from alkali metals, alkaline earth metals, or transition metals. Alternatively, the electron injection layer is formed from an organic material and a metal complex. Here, doping the organic material means that atoms or ions of the dopant are dispersed in the organic material to form a single phase. According to the present embodiment, the organic material is doped with Ba. Doping concentration of Ba is 40 wt % or less, preferably 20 wt % or less, and more preferably 15 wt % or less. This is because a high concentration of metal material in an electron injection layer leads to a decrease in transmittance of visible light and light emission efficiency. On the other hand, from the energy band structure described later, electron injection function does not depend on doping concentration unless the doping concentration is excessively low.

Alkali metals are, for example, lithium (Li), sodium (Na), potassium (K), rubidium (Rb), cesium (Cs), and francium (Fr), and alkaline earth metals are, for example, calcium (Ca), strontium (Sr), barium (Ba), and radium (Ra). Transition metals are, for example, titanium (Ti), ytterbium (Yb), and vanadium (V).

As the organic material used in the electron injection layer 16, for example, a x-electron system low-molecular-weight organic material may be used, such as an oxydiazole derivative (OXD), a triazole derivative (TAZ), or a phenanthroline derivative (BCP, Bphen). In view of the energy band structure described later, a material other than the organic material of the electron transport layer 15 is used.

Film thickness of the electron injection layer 16 is 40 nm or greater, and is a thickness suitable for the optical resonator structure described later. As mentioned above, a separation distance between the light-emitting layer 14 and the cathode 17 is greater than 100 nm, and therefore film thickness of the electron injection layer 16 is preferably in a range from 80 nm to 120 nm.

The cathode 17 includes at least one of a metal layer formed from a metal material and a metal oxide layer formed from a metal oxide. Film thickness of a metal layer of the cathode 17 is thin, set from 1 nm to 50 nm, and is light-transmissive. The metal material is light-reflective, but because the film thickness of the metal layer is equal to or less than 50 nm, light transmission can be ensured. Accordingly, a portion of light from the light-emitting layer 14 is reflected at the cathode 17 but a remaining portion is transmitted through the cathode 17.

Ag, an Ag alloy mainly composed of Ag, Al, or an Al alloy mainly composed of Al may be used as the metal material that forms the metal layer included in the cathode 17. As an Ag alloy, a magnesium-silver alloy (MgAg) or indium-silver alloy may be used. Ag basically has a low resistivity, and Ag alloys are preferable in that they have excellent heat and corrosion resistance and can maintain good electrical conductivity over a long period of time. As an Al alloy, a magnesium aluminium alloy (MgAl) or lithium aluminium alloy (LiAl) may be used. As other alloys that may be used, a lithium-magnesium alloy or a lithium-indium alloy may be used.

The metal layer included in the cathode 17 may be a simple layer formed from an Ag layer or a MgAg alloy layer, may be a layered structure including an Mg layer and an Ag layer (Mg/Ag), or may be a layered structure including an MgAg alloy layer and an Ag layer (MgAg/Ag).

As a metal oxide in a metal oxide layer in the cathode 17, indium tin oxide (ITO) or indium zinc oxide (IZO) may be used.

Further, the cathode 17 may be a simple metal layer or a simple metal oxide layer, may be a layered structure in which a metal oxide layer is layered on a metal layer, or may be a layered structure in which a metal layer is layered on a metal oxide layer.

2. Energy Band Structure

The organic EL element 1 is characterized by an energy band structure of the light-emitting layer 14, the electron transport layer 15, and the electron injection layer 16. The following describes energy levels of organic material forming the layers as energy levels of each layer.

FIG. 2 is a band diagram illustrating an energy band structure of the organic EL element 1. In FIG. 2, LUMO energy levels (hereinafter, "LUMO level") and highest occupied molecular orbital (HOMO) energy levels (hereinafter, "HOMO level") of the hole transport layer 13, the light-emitting layer 14, the electron transport layer 15, and the electron injection layer 16 are shown, and other layers are omitted. Further, FIG. 2 does not show electron vacuum level, but the lower the LUMO level and HOMO level in the band diagram, the greater the difference from the electron vacuum level, and the lower the energy level.

[2.1 Energy Barriers]

Energy barriers to injection of electrons from the cathode 17 to the light-emitting layer 14 exist at interfaces between each layer from the cathode 17 to the light-emitting layer 14. These energy barriers are caused by differences in LUMO level at each interface between a layer nearer the anode 11 and a layer nearer the cathode 17. In the following, an energy barrier to injection of electrons from the cathode 17 side to the anode 11 side at an interface between two adjacent layers is referred to as an "electron injection barrier".

In injection of electrons from the cathode 17 to the electron injection layer 16, electrons are transferred from the cathode 17 to dopant metal in the electron injection layer 16, and electrons are transferred from the dopant metal to the LUMO of organic material of the electron injection layer 16.

Thus, an electron injection barrier Eg (eil) from the cathode 17 to the electron injection layer 16 corresponds to a difference of a LUMO level 161 of the electron injection layer 16 and a Fermi level of dopant metal of the electron injection layer 16. In the present embodiment, the electron injection barrier Eg(eil) is 0 eV.

An electron injection barrier Eg(etl) from the electron injection layer 16 to the electron transport layer 15 is defined as a difference between a LUMO level 151 of the electron transport layer 15 and the LUMO level 161 of the electron injection layer 16. The LUMO level 151 of the electron transport layer 15 is lower in energy level than the LUMO level 161 of the electron injection layer 16, and Eg(etl) satisfies the following Expression (1). It is also preferable that Eg(etl) satisfies the following Expression (2). In the present embodiment, the electron injection barrier Eg(etl) is −0.3 eV.

$$Eg(etl) < 0 \quad \text{Expression (1)}$$

$$Eg(etl) \leq -0.3 \text{ eV} \quad \text{Expression (2)}$$

An electron injection barrier Eg(eml) from the electron transport layer 15 to the light-emitting layer 14 is defined as a difference between a LUMO level 141 of the light-emitting layer 14 and the LUMO level 151 of the electron transport layer 15. The electron injection barrier Eg(eml) is the greatest electron injection barrier among electron injection barriers present at interfaces between layers from the cathode 17 to the light-emitting layer 14. Eg(eml) preferably satisfies the following Expression (3), and more preferably satisfies the following Expression (4). In the present embodiment, the electron injection barrier Eg(eml) is 0.5 eV.

$$Eg(eml) > 0.3 \text{ eV} \quad \text{Expression (3)}$$

$$Eg(eml) \geq 0.5 \text{ eV} \quad \text{Expression (4)}$$

On the other hand, energy barriers to injection of holes from the anode 11 side to the light-emitting layer 14 exist at interfaces between each layer from the anode 11 to the light-emitting layer 14. These energy barriers are caused by differences in HOMO level at each interface between a layer nearer the anode 11 and a layer nearer the cathode 17. In the following, an energy barrier to injection of holes from the anode 11 side to the cathode 17 side at an interface between two adjacent layers is referred to as a "hole injection barrier".

A hole injection barrier Hg(eml) from the hole transport layer 13 to the light-emitting layer 14 is defined by a difference between a HOMO level 132 of the hole transport layer 13 and a HOMO level 142 of the light-emitting layer 14. In the present embodiment, the hole injection barrier Hg(eml) is 0.2 eV.

The electron injection barrier Eg(eml) and the hole injection barrier Hg(eml) may satisfy Expression (5), below. Further, the electron injection barrier Eg(eml) and the hole injection barrier Hg(eml) may satisfy Expression (6), below. In the case of Expression (6), Eg(eml) is of course greater than 0.3 eV. In the present embodiment, the electron injection barrier Eg(eml) of the organic EL element 1 is 0.3 eV greater than the hole injection barrier Hg(eml).

$$Eg(eml) > Hg(eml) \quad \text{Expression (5)}$$

$$Eg(eml) - Hg(eml) \geq 0.3 \text{ eV} \quad \text{Expression (6)}$$

Further, a hole injection barrier Hg(etl) to injection of holes from the light-emitting layer 14 to the electron transport layer 15 is defined by a difference between a HOMO level 152 of the electron transport layer 15 and the HOMO level 142 of the light-emitting layer 14. In the present embodiment, this is 0.9 eV.

The hole injection barrier Hg(etl) and the hole injection barrier Hg(eml) may satisfy Expression (7), below.

$$Hg(etl) > Hg(eml) \quad \text{Expression (7)}$$

Further, the electron injection barrier Eg(eml) and the hole injection barrier Hg(etl) satisfy Expression (8), below. Further, the electron injection barrier Eg(eml) and the hole injection barrier Hg(etl) satisfy Expression (9), below. In the present embodiment, the hole injection barrier Hg(etl) of the organic EL element 1 is 0.4 eV greater than the electron injection barrier Eg(eml).

$$Eg(eml) < Hg(etl) \quad \text{Expression (8)}$$

$$Hg(etl) - Eg(eml) \geq 0.4 \text{ eV} \quad \text{Expression (9)}$$

3. Resonator Structure

FIG. 3 illustrates light interference in an optical resonator structure of the organic EL element 1 pertaining to the present embodiment. The optical resonator structure is between an interface between the anode 11 and the hole injection layer 12 and an interface between the cathode 17 and the electron injection layer 16. The light-emitting layer 14 exists inside the optical resonator structure.

In FIG. 3, main paths of light emitted from the light-emitting layer 14 are shown. Path C1 shows light emitted from the light-emitting layer 14 towards the cathode 17, passing through the cathode 17 without being reflected. Path C2 shows light emitted from the light-emitting layer 14 towards the anode 11, reflected at the anode 11, and passing through the light-emitting layer 14 and the cathode 17. Path C3 shows light emitted from the light-emitting layer 14 towards the cathode 17, reflected at the cathode 17, reflected at the anode 11, and passing through the light-emitting layer 14 and the cathode 17. Interference occurs between light emitted via each of these paths C1, C2, C3.

A difference between optical distances of the path C1 and the path C2 corresponds to optical thickness L1 shown in FIG. 3. The optical thickness L1 is the sum of optical distance of the hole injection layer 12 and the hole transport layer 13, i.e. from the light-emitting layer 14 to the interface between the anode 11 and the hole injection layer 12 (the sum of the product of film thickness and refractive index of each layer).

A difference between optical distances of the path C2 and the path C3 corresponds to optical thickness L2 shown in FIG. 3. The optical thickness L2 is the sum of optical distance of the electron transport layer 15 and the electron injection layer 16, i.e. from the light-emitting layer 14 to the interface between the cathode 17 and the electron injection layer 16 (the sum of the product of film thickness and refractive index of each layer).

A difference between optical distances of the path C1 and the path C3 corresponds to optical thickness L3 shown in FIG. 3. The optical thickness L3 is the sum of the optical thickness L1 and the optical thickness L2.

In the optical resonator structure, each of the optical thicknesses L1, L2, L3 are set so that light emitted from each of the paths C1, C2, C3 amplifies light emitted from each other path. According to the present embodiment, the optical thickness L2 is set to second and subsequent peaks, that is, a first order interference peak, second order interference peak, . . . . Accordingly, a distance between the cathode 17 and the light-emitting layer 14 is approximately 150 nm or greater.

4. Experiments

In order to evaluate the influence on properties of the organic EL element 1 of film thicknesses of the electron transport layer 15 and electron injection layer 16 and dopant concentration of the metal dopant in the electron injection layer 16, samples were made for which the optical thickness L2 from the light-emitting layer 14 to the cathode 17 was substantially constant while film thicknesses of the electron transport layer 15 and the electron injection layer 16, and dopant concentration of barium in the electron injection layer 16 were different, and light emission efficiency, drive voltage, and lifetime of these samples were measured.

The energy band structure of the samples was such that, as shown in FIG. 2, Eg(eml) was 0.5 eV and Eg(etl) was −0.3 eV. HOMO level values were measured by using a photoelectron spectrometer (Riken Keiki Co., Ltd., model AC-2). Further, LUMO level values were obtained by taking thin film optical absorption edges as energy gaps, and subtracting from the HOMO level values.

In sample A, which was a working example, the electron transport layer had a film thickness of 15 nm. Further, the electron injection layer 16 had a film thickness of 105 nm and dopant concentration was 5 wt %. On the other hand, in sample B, which was a comparative example, the electron transport layer 15 had a film thickness of 120 nm, the electron injection layer 16 had a film thickness of 3 nm, and dopant concentration was 30 wt %. Further, in sample C, which was a comparative example, the electron transport layer 15 had a film thickness of 15 nm, the electron injection layer 16 had a film thickness of 3 nm, and dopant concentration was 30 wt %. By providing an intermediate layer having a film thickness of 105 nm between the electron transport layer 15 and the electron injection layer 16, optical thickness L2 was made the same as that of samples A and B. Further, in consideration of potential deterioration of properties due to electron injection barrier influence between the electron transport layer and intermediate layer, and between the intermediate layer and electron injection layer, a material was selected for which the LUMO of the intermediate layer and the LUMO of organic material of the electron injection layer were the same.

FIG. 4 is a table showing measurement results for samples A, B, and C. Note that light emission efficiency, drive voltage, and lifetime are shown as values relative to the values of sample A, which were taken to be 100.

For sample B, drive voltage increased, and light emission efficiency and lifetime decreased. This is thought to be caused by the increased film thickness of the electron transport layer 15, which has a high electrical resistance.

For sample C also, drive voltage increased, and light emission efficiency and lifetime decreased. This is because the intermediate layer was present between the electron transport layer 15 and the electron injection layer 16, and therefore an energy level of the intermediate layer had an effect on an electron injection barrier. In particular, when a LUMO level of the intermediate layer (Fermi level if the intermediate layer is not a semiconductor) is higher than a LUMO level of the electron injection layer 16, an electron injection barrier between the intermediate layer and the electron injection layer 16 causes a decrease in electron injection to the intermediate layer. Further, when a LUMO level of the intermediate layer (Fermi level if the intermediate layer is not a semiconductor) is lower than a LUMO level of the electron transport layer 15, an electron injection barrier between the intermediate layer and the electron transport layer 15 causes a decrease in electron injection to the electron transport layer 15.

In contrast, sample A according to the embodiment had lower drive voltage and an improved light emission efficiency and lifetime over samples B and C, which were comparative examples. The following reasons for this may be considered. First, in samples A and B, the energy band structure satisfies Expressions (1) to (6), and therefore electron injectivity from the cathode 17 to the light-emitting layer 14 is greatly influenced by the electron injection barrier Eg(eml) and organic EL element drive voltage, light emission efficiency, and lifetime is not very dependent on dopant concentration of barium in the electron injection layer 16. Accordingly, in sample A, dopant concentration of barium in the electron injection layer 16 is lower than that of samples B and C. Thus, for sample A, despite thickening of the electron injection layer 16, absorption of visible light by barium is small, and therefore decrease in light extraction efficiency is suppressed. On the other hand, compared to sample B, the electron transport layer 15, which has a high electrical resistance, is thin, and the electron injection layer 16, which has a low electrical resistance, is thick, and therefore drive voltage is low.

Accordingly, when applying the energy band structure shown in FIG. 2 and applying the optical resonance structure, it is preferable to increase film thickness of the electron injection layer 16 so that the optical thicknesses L2 and L3 become a desired optical distance.

5. Summary

As described above, according to the organic EL element 1 pertaining to the present embodiment, a difference between the LUMO level 141 of the light-emitting layer 14 and the LUMO level 151 of the electron transport layer 15 is at least 0.3 eV. Thus, the electron injection barrier Eg(eml) to the light-emitting layer 14 is at least 0.3 eV and holes are sufficiently supplied to the light-emitting layer 14 and spread toward the cathode 17. Accordingly, a recombination region in the light-emitting layer 14 becomes wider in a film thickness direction, and a longer lifetime of the organic EL element 1 can be expected.

Further, in the organic EL element 1 pertaining to the present embodiment, the LUMO level 151 of the electron transport layer 15 is lower than the LUMO level 161 of the electron injection layer 16, and the electron injection barrier Eg(etl) to the electron transport layer 15 is a negative value. Accordingly, even if there is variation in metal material dopant concentration in the electron injection layer 16, it is difficult for the electron injection barrier Eg(etl) from the electron injection layer 16 to the electron transport layer 15 to be larger than the electron injection barrier Eg(eml) from the electron transport layer 15 to the light-emitting layer 14. Accordingly, electron injection from the cathode 17 to the light-emitting layer 14 is determined by the largest electron injection barrier Eg(eml), and influence of variation in metal material dopant concentration in the electron injection layer 16 on drive voltage, light emission efficiency, and lifetime of the organic EL element 1 can be suppressed.

According to the organic EL element 1 of the present embodiment, the optical thickness L2 is set to second and subsequent peaks, that is, a first order interference peak, second order interference peak, . . . . Accordingly, an insufficient film thickness of each of the hole injection layer 12, the hole transport layer 13, the light-emitting layer 14, the electron transport layer 15, and the electron injection layer 16 can be avoided, and a decrease in drive voltage and improved light emission efficiency and lifespan of the organic EL element can be achieved.

Further, in the organic EL element 1 pertaining to the present embodiment, the electron injection layer 16 has a greater film thickness than the electron transport layer 15. The electron injection layer 16 has a higher electric conductivity than the electron transport layer 15, and its influence on drive voltage, light emission efficiency, and lifetime of the organic EL element is small. Accordingly, an optical resonance structure can be formed while suppressing influence on drive voltage, light emission efficiency, and lifetime of the organic EL element 1.

Embodiment 2

According to Embodiment 2, an organic EL display panel 100 is described in which a plurality of the organic EL elements according to Embodiment 1 are arrayed on a substrate.

1. Configuration of Organic EL Display Panel

Figure 5:
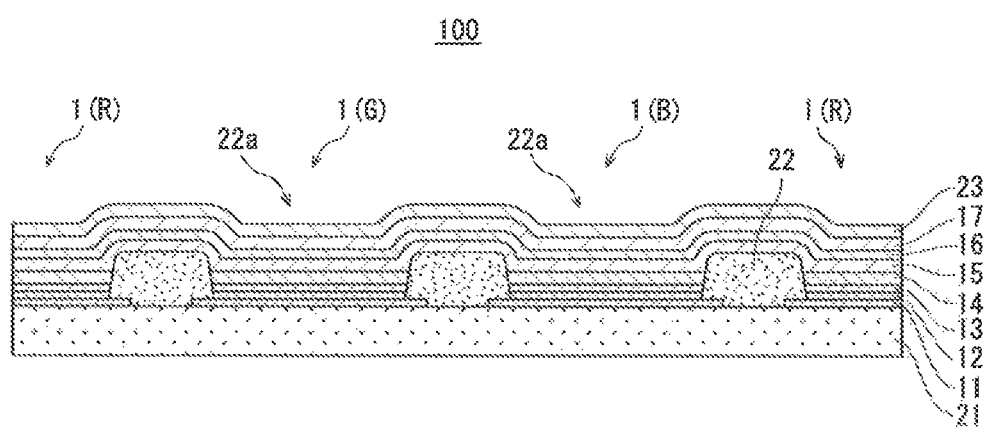
FIG. 5 is a partial cross-section of organic EL display panel 100 pertaining to Embodiment 2.

FIG. 5 is a partial cross-section of the organic EL display panel 100 (see FIG. 8) pertaining to Embodiment 2. The organic EL display panel 100 has a plurality of pixels, each pixel including the organic EL elements 1(R), 1(G), 1(B), which emit red, green, and blue light respectively. FIG. 5 illustrates a cross-section centered on one of the organic EL elements 1(B), which emits blue light.

In the organic EL display panel 100, each of the organic EL elements 1 are so-called "top-emission" types that emit light in a forwards direction (towards the top of the page in FIG. 5).

The organic EL element 1(R), the organic EL element 1(G), and the organic EL element 1(B) have substantially the same configuration as each other, and therefore the following describes them together as the organic EL element 1.

As shown in FIG. 5, the organic EL element 1 includes a TFT substrate 21, the anode 11, a bank layer 22, the hole injection layer 12, the hole transfer layer 13, the light-emitting layer 14, the electron transport layer 15, the electron injection layer 16, the cathode 17, and a sealing layer 23. The TFT substrate 21, the electron transport layer 15, the electron injection layer 16, the cathode 17, and the sealing layer 23 are not formed per pixel, but are continuous across a plurality of the organic EL elements 1 included in the organic EL display panel 100.

In the following, description is omitted regarding the configuration of the organic EL element 1 as described according to Embodiment 1, and only elements added to the organic EL display panel 100 pertaining to Embodiment 2 are described.

The TFT substrate 21 includes a base material that is insulative, a thin film transistor (TFT) layer, and an interlayer insulating layer. In the TFT layer is a drive circuit for each pixel. The base material is, for example, a substrate made from a glass material. As a glass material, alkali-free glass, soda glass, non-fluorescent glass, phosphate glass, borate glass, or quartz glass may be used. The interlayer insulating layer is made from a resin material, and planarizes a stepped upper surface of the TFT layer. As the resin material, a positive photosensitive material may be used. Further, as the photosensitive material, acrylic resin, polyimide resin, siloxane resin, or phenol resin may be used.

Further, although not shown in FIG. 5, a contact hole is formed for each pixel in the interlayer insulating layer of the TFT substrate 21.

The anode 11 is disposed on the interlayer insulating layer of the TFT substrate 21. The anode 11 is formed for each pixel, and is electrically connected to the TFT layer via the contact hole. The anode 11 may be a simple metal layer, or may be a layered structure in which layers made from a metal oxide such as ITO or IZO are layered on a metal layer.

The bank layer 22 is disposed on the anode 11, leaving a portion of a top surface of the anode 11 exposed and covering a surrounding region of the anode 11. A region of the top surface of the anode 11 that is not covered by the bank layer 22 (hereinafter, "opening") corresponds to a sub-pixel. In other words, the bank layer 22 has an opening 22a for each sub-pixel.

The hole injection layer 12, the hole transport layer 13, and the light-emitting layer 14 are layered in this order on the anode 11 within the opening 22a.

According to the present embodiment, portions of the bank layer 22 that are not disposed on the anode 11 are disposed on the TFT substrate 21. In other words, for the portions of the bank layer 22 not on the anode 11, a bottom surface of the bank layer 22 is in contact with a top surface of the TFT substrate 21.

The bank layer 22 is made from, for example, an insulative material (for example, acrylic resin, polyimide resin, novolac resin, or phenolic resin). If the light-emitting layer 14 is formed by using a coating application method, the bank layer 22 functions as a structure to prevent applied ink from overflowing, and if the light-emitting layer 14 is formed by using vapor deposition, the bank layer 22 functions as a structure for mounting a vapor deposition mask. According to the present embodiment, the bank layer 22 is made from a resin material that is, for example, a positive photosensitive material. Further, as the photosensitive material, acrylic resin, polyimide resin, siloxane resin, or phenol resin may be used. According to the present embodiment, phenolic resin is used.

On the cathode 17 that is disposed across the sub-pixels is disposed the sealing layer 23, which is intended to suppress degradation of the light-emitting layer 14 due to contact with moisture, oxygen, etc. Because the organic EL display panel 100 is a top-emission type, material of the sealing layer 23 can be selected from a light-transmissive material such as silicon nitride (SiN) or silicon oxynitride (SiON).

Although not shown in FIG. 5, a color filter and upper substrate may be bonded on top of the sealing layer 23 via the sealing resin. By bonding the upper substrate, the hole transport layer 13, the light-emitting layer 14, the electron transport layer 15, and the electron injection layer 16 can be protected from water, air, etc.

2. Manufacture of Organic EL Element

Method of manufacture of the organic EL element 1 is described with reference to FIG. 6A, FIG. 6B, FIG. 6C, FIG. 6D, FIG. 6E, FIG. 6F, FIG. 7A, FIG. 7B, FIG. 7C, and FIG. 7D. FIG. 6A to FIG. 7D show cross-sections schematically illustrating manufacture of the organic EL element 1.

Figure 6A:
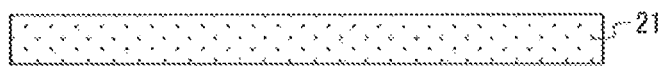
FIG. 6A to FIG. 6F are partial cross-sections schematically illustrating a portion of steps of manufacturing organic EL element 1 pertaining to Embodiment 2.
Figure 6B:
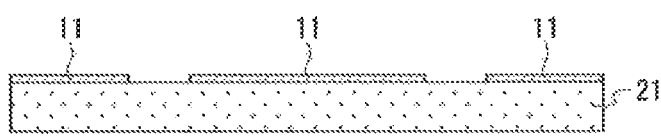

Initially, as shown in FIG. 6A, the TFT substrate 21 is prepared. Subsequently, for each sub-pixel, a thin film of film thickness in a range from 50 nm to 500 nm is formed by vacuum deposition or sputtering of a metal material, forming the anode 11 as shown in FIG. 6B.

Figure 6C:
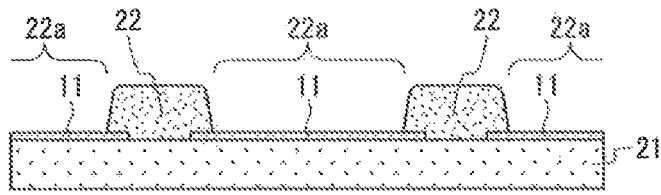

Subsequently, on the anode 11, bank layer resin that is the material of the bank layer 22 is uniformly applied to form a bank material layer. For the bank layer resin, for example, a positive photosensitive material is used such as phenolic resin. Pattern forming in the shape of the bank layer 22 is performed by exposing the bank material layer to light and performing developing, and the bank layer 22 is formed by baking (FIG. 6C). This baking is performed, for example, at a temperature in a range from 150° C. to 210° C. for 60 minutes. The bank layer 22 defines the opening 22a, which is a region in which the light-emitting layer 14 is formed.

Further, in forming the bank layer 22, surface treatment of a surface of the bank layer 22 may be performed with a predefined alkaline solution, water, an organic solvent, or the like, or a plasma treatment may be performed. Surface treatment of the bank layer 22 is performed for the purposes of adjusting the contact angle of ink applied to the opening 22a and imparting liquid repellency to a surface of the bank layer 22.

Figure 6D:
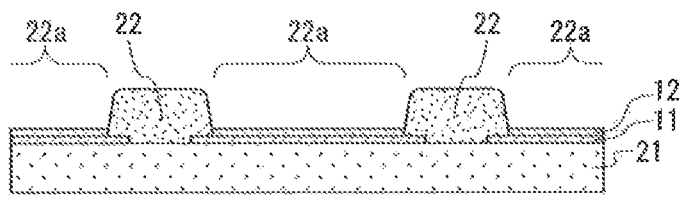

Subsequently, by using mask deposition or application by inkjet, material of the hole injection layer 12 is deposited, and baked to form the hole injection layer 12 as shown in FIG. 6D.

Figure 6E:
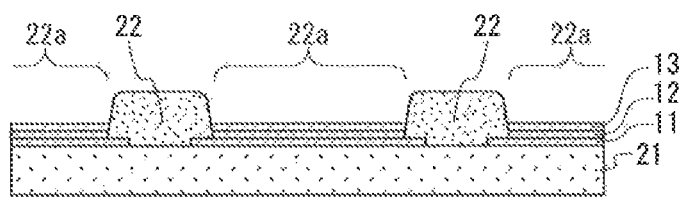

Subsequently, ink including material of the hole transport layer 13 is applied to the opening 22a defined by the bank layer 22, and baked to form the hole transport layer 13 as shown in FIG. 6E.

Figure 6F:
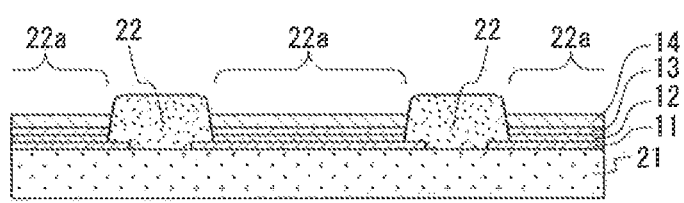

Similarly, ink including material of the light-emitting layer 14 is applied and baked to form the light-emitting layer 14 as shown in FIG. 6F.

Figure 7A:
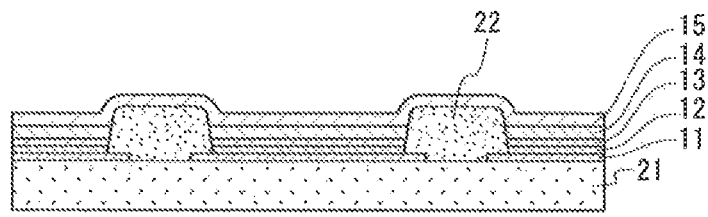
FIG. 7A to FIG. 7D are partial cross-sections schematically illustrating a portion of steps of manufacturing organic EL element 1 pertaining to Embodiment 2, continuing from FIG. 6F.

Subsequently, as shown in FIG. 7A, on the light-emitting layer 14, the electron transport layer 15 is formed to have a film thickness thicker than 1 nm and thinner than 30 nm by using vacuum deposition or similar for an organic material. The electron transport layer 15 is also formed on the bank layer 22.

Figure 7B:
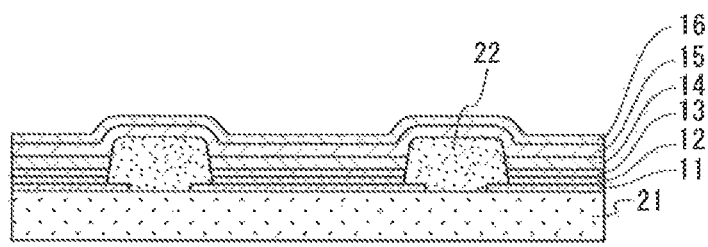

As shown in FIG. 7B, the electron injection layer 16 is formed on the electron transport layer 15 by co-evaporation of an organic material and a metal material, to have a film thickness greater than 80 nm and equal to or less than 120 nm. At such time, layer formation is performed according to design values of optical thickness L2 and L3.

Figure 7C:
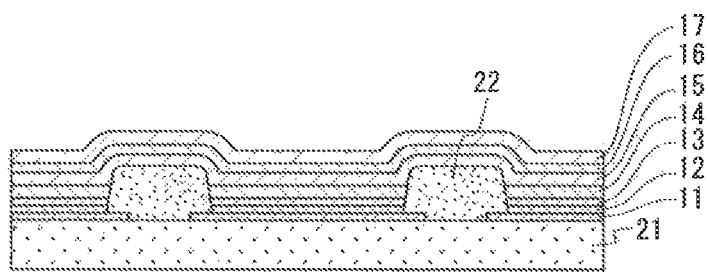

Subsequently, as shown in FIG. 7C, the cathode 17 is formed on the election injection layer 16 by using vacuum deposition, sputtering, or similar, of a metal material or metal oxide material.

Figure 7D:
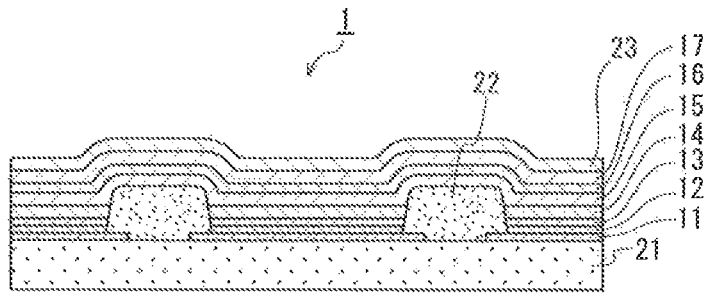

Subsequently, the sealing layer 23 is formed on the cathode 17 by using sputtering, CVD, or similar, on a light-transmissive material such as SiN or SiON, as shown in FIG. 7D.

According to the processes described above, the organic EL element 1 is completed, and the organic EL display panel 100 that includes a plurality of the organic EL element 1 is also thereby completed. Note that the color filter and the upper substrate may be bonded onto the sealing layer 23.

3. Overall Configuration of Organic EL Display Device

Figure 8:
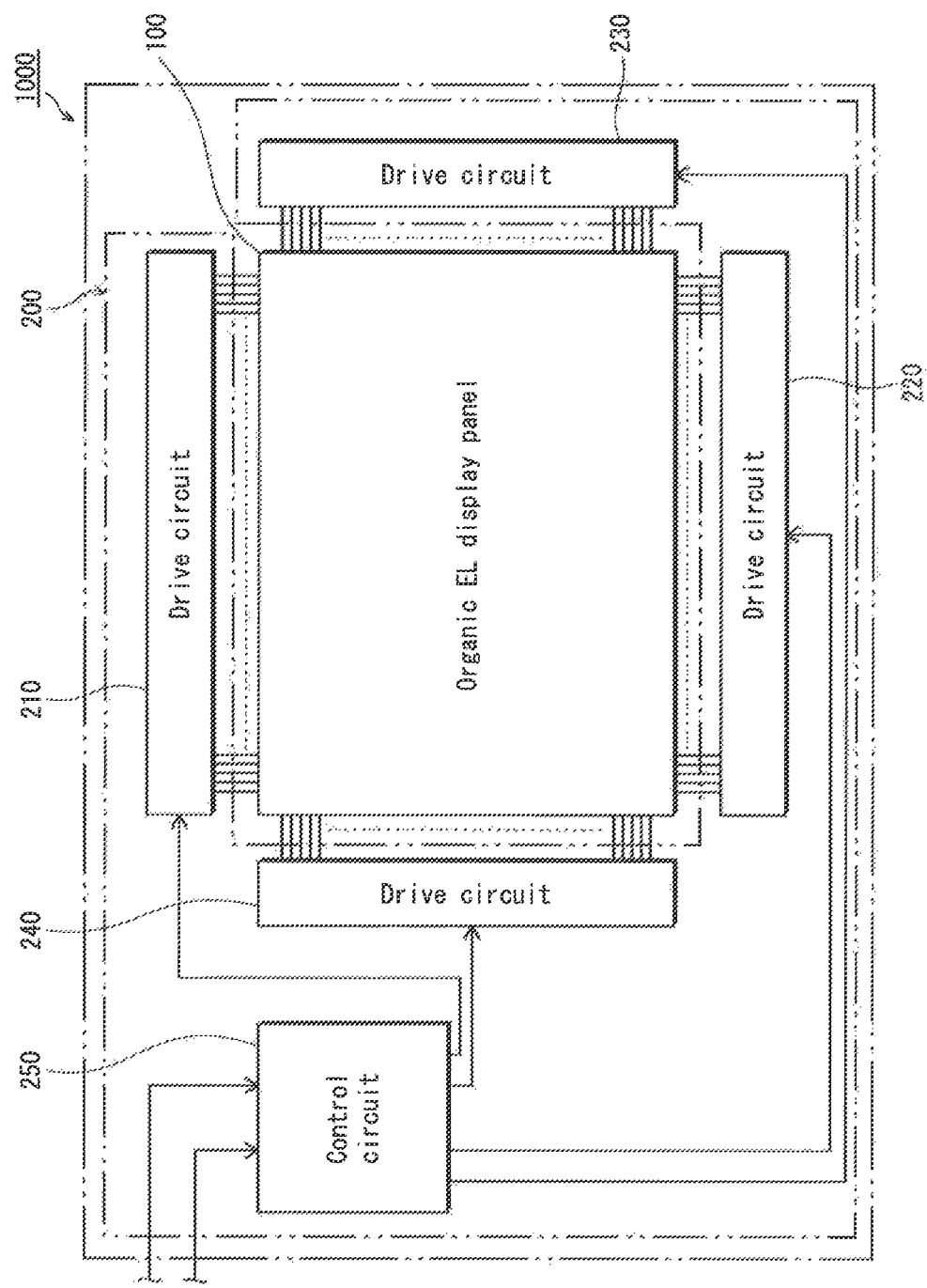
FIG. 8 is a block diagram illustrating organic EL display device 1000 equipped with the organic EL element 1 pertaining to Embodiment 2.

FIG. 8 is a schematic block diagram illustrating a configuration of an organic EL display device 1000. As shown in FIG. 8, the organic EL display device 1000 includes the organic EL display panel 100 and a drive controller 200 connected thereto. The driver controller 200 includes four drive circuits 210, 220, 230, 240 and a control circuit 250.

Note that the organic EL display device 1000 is not limited to this arrangement of the driver controller 200 relative to the organic EL display panel 100.

Modifications

Embodiment 1 and Embodiment 2 are described above, but the present disclosure is not limited to these embodiments. For example, the following modifications can be implemented.

(Modification 1) According to each embodiment, the electron injection layer 16 is formed by doping an organic material with a metal selected from alkali metals, alkaline earth metals, or transition metals. However, as long as the electron injection layer 16 is formed from a material that is highly transmissive of visible light and realizes the function of improving electron injectability from the cathode 17, the electron injection layer 16 need not be formed from a combination of an organic material host material doped with a metal.

The electron injection layer 16 may be formed from two or more organic materials, such as a combination of Bathocuproine (BCP), which has high electron transport mobility, and a quinolinol Al complex (Alq), which has high electron injectability from the cathode 17 and high electron transport mobility. However, a metal complex such as quinolinol Al complex (Alq) is used as at least one kind of material. In such a case, the electron injection layer can be formed by using methods such as co-evaporation of the two or more organic materials.

(Modification 2) The electron transport layer 15 according to each embodiment is described as not including at least one of an alkali metal, alkaline earth metal, or transition metal. However, the electron transport layer 15 may be formed from an organic material doped with a metal selected from alkali metals, alkaline earth metals, or transition metals.

In such an electron transport layer, when Fermi level of the metal dopant is higher than LUMO level of the organic material, the electron injection barrier Eg(etl) from the electron injection layer 16 to the electron transport layer 15 is defined by a difference between Fermi level of the metal dopant in the electron transport layer 15 and LUMO level of the electron injection layer 16. Further, the electron injection barrier Eg(eml) from the electron transport layer 15 to the light-emitting layer 14 is defined as a difference between LUMO level of the light-emitting layer 14 and Fermi level of the metal dopant in the electron transport layer 15.

In this modification, designing the energy band structure so that the electron injection barrier Eg(etl) satisfies Expression (1) makes the electron injection barrier Eg(eml) large, and suppresses variation in properties across a plurality of the organic EL element 1.

(Modification 3) The organic EL element 1 of each embodiment is provided with the hole injection layer 12, but the organic EL element can be implemented without this layer.

(Modification 4) According to Embodiment 2, the base material of the organic EL element 1 is described as having glass as an insulative material, but this is just an example. As the insulative material for the base material, resin or ceramics may be used, for example. As a ceramic for the base material, alumina may be used, for example. As a resin for the base material, an insulative material such as polyimide resin, acrylic resin, styrene resin, polycarbonate resin, epoxy resin, polyethersulfone, polyethylene, polyester, or silicone resin may be used. When resin is used for the base material, the resin may be flexible, but this is usually associated with high permeability to oxygen and moisture, which may lead to deterioration of metal material caused by oxygen and moisture. In the organic EL panel 100 pertaining to the embodiments, an organic EL element using such a resin base material is particularly suitable, due to the stabilizing of properties with respect to variation in doping concentration of metal material in the electron injection layer 16.

(Modification 5) According to each embodiment, a top-emission structure is described in which the anode 11 is light-reflective and the cathode 17 is light-transmissive. However, a bottom-emission structure may be implemented in which the anode 11 is light-transmissive and the cathode 17 is light-reflective.

(Modification 6) According to the embodiments, the hole transport layer 13 and the light-emitting layer 14 are manufactured by using ink application, but this is just an example. For example, at least one of the hole transport layer 13 and the light-emitting layer 14 may be manufactured by using vapor deposition.

(Modification 7) According to the embodiments, the optical resonator structure is designed through film thickness of the electron injection layer 16, but the present invention is not limited to this example. For example, an optical adjustment layer may be provided between the electron injection layer 16 and the cathode 17, and the optical resonator structure may be designed according to a design of film thickness of both the electron injection layer 16 and the optical adjustment layer. With such a design, the optical adjustment layer does not affect electron injection from the electron injection layer 16 to the light-emitting layer 14. A light-transmissive conductive film having both high visible light transmittance and high electric conductivity is suitable for the optical adjustment layer, and it is preferable that a refractive index of the optical adjustment layer is different from that of the cathode 17. For example, if the cathode 17 is an oxide such as ITO or IZO, the optical adjustment layers is preferably a metal thin film such as silver, aluminium, silver alloy, or aluminium alloy, and if the cathode 17 is a metal thin film, the optical adjustment layer is preferably a light-transmissive conductive film such as ITO or IZO.

The technology pertaining to the present disclosure is useful in display devices, television devices, portable electronic devices, lighting, and the like, for home use, public facilities, and business use.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

What is claimed is:

1. An organic EL element, comprising:
an anode;
a cathode opposing the anode;
a light-emitting layer disposed between the anode and the cathode;
an electron transport layer disposed in contact with a cathode-side surface of the light-emitting layer; and
an electron injection layer disposed between the electron transport layer and the cathode, in contact with the electron transport layer,
wherein lowest unoccupied molecular orbital (LUMO) level of the electron transport layer is lower in energy level than LUMO level of the electron injection layer,
wherein a difference between highest occupied molecular orbital (HOMO) level of the electron transport layer and HOMO level of the light-emitting layer is greater than a difference between LUMO level of the light-emitting layer and LUMO level of the electron transport layer, and
wherein film thickness of the electron injection layer is greater than film thickness of the electron transport layer.

2. The organic EL element of claim 1,
wherein the difference between the HOMO level of the electron transport layer and the HOMO level of the light-emitting layer is at least 0.4 eV greater than the difference between the LUMO level of the light-emitting layer and the LUMO level of the electron transport layer.

3. The organic EL element of claim 1,
wherein a metal material included in the electron injection layer is one of an alkali metal, an alkaline earth metal, and a transition metal.

4. The organic EL element of claim 3,
wherein the metal material included in the electron injection layer is barium.

5. The organic EL element of claim 1,
wherein an optical adjustment layer is disposed between the electron injection layer and the cathode.

6. The organic EL element of claim 5,
wherein the optical adjustment layer is a light-transmissive electrically-conductive film.

7. The organic EL element of claim 1,
wherein the anode is light-reflective, the cathode is light-transmissive, and
light emitted from the light-emitting layer is emitted from the cathode side of the organic EL element.

8. An organic EL panel, in which the organic EL elements of claim 1 are arrayed on a substrate.

9. The organic EL panel of claim 8,
wherein the substrate is a flexible substrate.

10. The organic EL panel of claim 8,
wherein the electron injection layer is a continuous layer across the plurality of the organic EL element.

11. The organic EL element of claim 1,
wherein an electron injection barrier from the cathode to the electron injection layer corresponds to a difference of the LUMO level of the electron injection layer and a Fermi level of a metal material of the electron injection layer.

12. The organic EL element of claim 1,
wherein an electron injection barrier from the electron injection layer to the electron transport layer corresponds to a difference between the LUMO level of the electron transport layer and the LUMO level of the electron injection layer.

13. The organic EL element of claim 1,
wherein a hole injection barrier from the hole transport layer to the light-emitting layer corresponds to a difference between the HOMO level of the hole transport layer and the HOMO level of the light-emitting layer.

14. The organic EL element of claim 13, wherein the hole injection barrier is at least 0.2 eV.

15. The organic EL element of claim 1,
wherein a hole injection barrier to injection of holes from the light-emitting layer to the electron transport layer corresponds to a difference between the HOMO level of the electron transport layer and the HOMO level of the light-emitting layer.

16. The organic EL element of claim 15, wherein the hole injection barrier is at least 0.9 eV.

17. An organic EL element, comprising:
an anode;
a cathode opposing the anode;
a light-emitting layer disposed between the anode and the cathode;
an electron transport layer disposed in contact with a cathode-side surface of the light-emitting layer; and
an electron injection layer disposed between the electron transport layer and the cathode, in contact with the electron transport layer,
wherein the electron transport layer includes a metal material,
a difference between highest occupied molecular orbital (HOMO) of the electron transport layer and HOMO level of the light-emitting layer is greater than a difference between lowest unoccupied molecular orbital (LUMO) level of the light-emitting layer and Fermi level of a metal material in the electron transport layer, and
film thickness of the electron injection layer is greater than film thickness of the electron transport layer.

18. The organic EL element of claim 17,
wherein the difference between the HOMO level the electron transport layer and the HOMO level of the light-emitting layer is at least 0.4 eV greater than the difference between the LUMO level of the light-emitting layer and the Fermi level of the metal material in the electron transport layer.

* * * * *